United States Patent
Quay et al.

(10) Patent No.: US 10,115,803 B2
(45) Date of Patent: Oct. 30, 2018

(54) FIELD-EFFECT TRANSISTOR AND METHOD FOR THE FABRICATION THEREOF

(71) Applicant: Fraunhofer-Gesellschaft zur Förderung der angewandten Forschung e.V., München (DE)

(72) Inventors: Rüdiger Quay, Freiburg (DE); Klaus Köhler, Freiburg (DE)

(73) Assignee: Fraunhofer-Gesellschaft zur Forderung der angewandten Forschung e.V., Munich (DE)

( * ) Notice: Subject to any disclaimer, the term of this patent is extended or adjusted under 35 U.S.C. 154(b) by 0 days.

(21) Appl. No.: 14/555,619

(22) Filed: Nov. 27, 2014

(65) Prior Publication Data
US 2015/0145032 A1 May 28, 2015

(30) Foreign Application Priority Data
Nov. 28, 2013 (DE) .................. 10 2013 224 361

(51) Int. Cl.
*H01L 29/66* (2006.01)
*H01L 29/78* (2006.01)
(Continued)

(52) U.S. Cl.
CPC .... *H01L 29/66522* (2013.01); *H01L 21/2205* (2013.01); *H01L 29/0843* (2013.01);
(Continued)

(58) Field of Classification Search
CPC .................. H01L 29/7835; H01L 29/1054
See application file for complete search history.

(56) References Cited

U.S. PATENT DOCUMENTS 7,041,538 B2 * 5/2006 Ieong ................ H01L 29/66545
257/E21.415
2005/0236646 A1 10/2005 Waki et al.
(Continued)

OTHER PUBLICATIONS

K. Kohler et al., "Control of the Mg doping profile in III-N light-emitting diodes and its effect on the electroluminescence efficiency", Journal of Applied Physics vol. 97, 104914-1-104914-4, published online on May 10, 2005.
(Continued)

*Primary Examiner* — Fernando L Toledo
*Assistant Examiner* — Neil Prasad
(74) *Attorney, Agent, or Firm* — Masuvalley & Partners

(57) ABSTRACT

The invention relates to a field-effect transistor and a method for its manufacturing having at least one layer, said layer comprising a III-V compound semiconductor, wherein the compound semiconductor comprises at least one element from the chemical group III being selected from any of gallium, aluminum, indium and/or boron and wherein the compound semiconductor comprises at least one element from the chemical group V being selected from nitrogen, phosphorous and/or arsenic, wherein the compound semiconductor comprises at least nitrogen, wherein the field-effect transistor comprises at least any of a source electrode and/or a drain electrode, said source electrode and/or drain electrode comprising at least one doped region extending from the surface into the at least one layer, wherein the depth of penetration of said doped region is selected from approximately 10 nm to approximately 200 nm.

17 Claims, 1 Drawing Sheet

(51) Int. Cl.
*H01L 29/778* (2006.01)
*H01L 29/08* (2006.01)
*H01L 21/22* (2006.01)
*H01L 29/20* (2006.01)

(52) U.S. Cl.
CPC .. *H01L 29/66462* (2013.01); *H01L 29/66636* (2013.01); *H01L 29/7787* (2013.01); *H01L 29/78* (2013.01); *H01L 29/2003* (2013.01)

(56) References Cited

U.S. PATENT DOCUMENTS

| | | | |
|---|---|---|---|
| 2007/0228418 A1 | 10/2007 | Herman | |
| 2007/0269968 A1 | 11/2007 | Saxler et al. | |
| 2007/0284615 A1* | 12/2007 | Ku et al. | 257/196 |
| 2011/0147838 A1* | 6/2011 | Gossner et al. | 257/345 |
| 2012/0018798 A1* | 1/2012 | Mauder | H01L 29/063 257/328 |
| 2013/0105763 A1 | 5/2013 | Yin et al. | |
| 2013/0113041 A1* | 5/2013 | Liu | H01L 29/66492 257/335 |

OTHER PUBLICATIONS

K. Kohler et al., "The surface potential of GaN:Si", Journal of Applied Physics vol. 103, 023706-1-023706-5, published online on Jan. 22, 2008.

K. Kohler et al., "Diffusion of Mg dopant in metal-organic vapor-phase epitaxy grown GaN and AlxGa12xN", Journal of Applied Physics vol. 113, 073514-1-073514-13, published online on Feb. 21, 2013.

Ronnie Simon et al., "Implantation Studies on Silicon-Doped GaN", Journal of Electronic Materials, vol. 42, No. 1, p. 21-25, DOI: 10.1007/s11664-012-2278-0, published online on Oct. 20, 2012.

K. Kohler et al., "Mg doping profile in III—N. light emitting diodes in close proximity to the active region", Physica Status Solidi (a), vol. 203, No. 7, p. 1802-1805, DOI 10.1002/pssa.200565125, published online on May 22, 2006.

* cited by examiner

FIELD-EFFECT TRANSISTOR AND METHOD FOR THE FABRICATION THEREOF

CROSS-REFERENCE TO RELATED APPLICATIONS

This application claims priority from German application No. 102013224361.8, filed Nov. 28, 2013 which is incorporated herein by reference in its entirety.

BACKGROUND OF THE INVENTION

The invention relates in one embodiment to a field effect transistor having at least one layer that consists of or comprises a III-V compound semiconductor, wherein the compound semiconductor comprises at least one element from the chemical group III being selected from any of gallium, aluminium, indium and/or boron and also comprises at least one element from the chemical group V being selected from nitrogen, phosphorous and/or arsenic and comprises at least nitrogen.

In another embodiment, the invention relates to a method for manufacturing a field effect transistor having at least one layer that consists of or comprises a III-V compound semiconductor, wherein the compound semiconductor comprises at least one element from the chemical group III being selected from any of gallium, aluminium, indium and/or boron and also comprises at least one element from the chemical group V being selected from nitrogen, phosphorous and/or arsenic.

US 2005/0236646 A1 discloses a field effect transistor. Said known field effect transistor comprises a plurality of layers that each comprise different III-V compound semiconductors. The source and drain contacts of the known field effect transistor are manufactured by metal layers that are deposited on the surface of the semiconductor material. Subsequent tempering partially diffuses the metal into the semiconductor material, so that doped regions form in the adjoining semiconductor material, thereby allowing a predefined resistive response from the contact.

However, this known field effect transistor has the disadvantage that the depth of penetration may be controlled only inadequately due to the diffusion process. Usually, the depth of penetration amounts several μm, but at least 1 μm. Thus, the structural size of a known field effect transistor is relatively high, which means that integrated circuits may be built only with low complexity. Finally, the contact may diffuse into the semiconductor material to such an extend that an unwanted parasitic current flow may be formed parallel to the channel of the field effect transistor. In this case, the field effect transistor is usually out of specifications and has to be discarded. This increases production scrap and lowers the yield of the manufacturing process.

Therefore, it is an object of the invention to provide a field effect transistor and a method for its production with lower production scrap and higher yield of the manufacturing process.

SUMMARY

In one aspect, the invention relates to a field-effect transistor having at least one layer, said layer comprising a III-V compound semiconductor, wherein the compound semiconductor comprises at least one element from the chemical group III being selected from any of gallium, aluminium, indium and/or boron and wherein the compound semiconductor comprises at least one element from the chemical group V being selected from nitrogen, phosphorous and/or arsenic, wherein the compound semiconductor comprises at least nitrogen, wherein the field-effect transistor comprises at least any of a source electrode and/or a drain electrode, said source electrode and/or drain electrode comprising at least one doped region extending from the surface into the at least one layer, wherein the depth of penetration of said doped region is selected from approximately 10 nm to approximately 200 nm.

In another aspect, the invention relates to a method for manufacturing a field effect transistor having at least one layer, said layer comprising a III-V compound semiconductor, said method comprising at least the steps of providing a substrate; depositing the at least one layer from a compound semiconductor onto the substrate by means of MOCVD, wherein the compound semiconductor comprises at least one element from the chemical group III being selected from any of gallium, aluminium, indium and/or boron and wherein the compound semiconductor comprises at least one element from the chemical group V being selected from nitrogen, phosphorous and/or arsenic, wherein the compound semiconductor comprises at least nitrogen; Producing any of at least one source electrode and/or at least one drain electrode by forming at least one doped region extending from the surface into the at least one layer, wherein the depth of penetration of said doped region is selected from approximately 10 nm to approximately 200 nm.

BRIEF DESCRIPTION OF THE DRAWINGS

The invention will be explained in more detail below with reference to figures without limiting the general concept of the invention. In the figures.

DETAILED DESCRIPTION OF THE INVENTION

Figure 1:
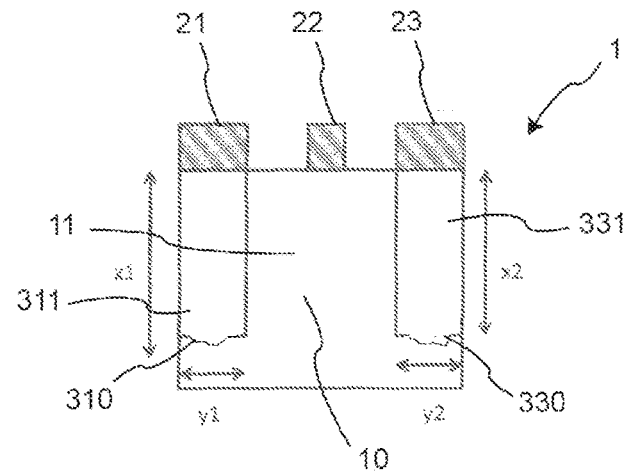
FIG. 1 illustrates the cross-section through a field effect transistor based on the prior art.

According to the invention, a field effect transistor is provided having at least one layer that that consists of or comprises a III-V compound semiconductor, wherein the compound semiconductor comprises at least one element from the chemical group III being selected from any of gallium, aluminium, indium and/or boron and also comprises at least one element from the chemical group V being selected from any of nitrogen, phosphorous, antimony and/or arsenic. However, the compound semiconductor comprises at least nitrogen from the chemical group V of the periodic table of the elements. In some embodiments of the invention, a further element from the chemical group V may optionally be included.

In some embodiments of the invention, the compound semiconductor may comprise a binary, ternary or quaternary compound of said elements. In some embodiments of the invention the III-V compound semiconductor comprises at least one compound being selected from the group comprising GaN, AlGaN, GaInNP, GaNAs, AlGaNAs or a similar compound.

In some embodiments of the invention, the compound semiconductor may have a Wurtzite crystal structure. In some embodiments, the compound semiconductor may have a direct band gap that is selected between approximately 0.8 eV and approximately 6.3 eV.

The layer of said compound semiconductor may be deposited heteroepitaxially on a substrate. Those skilled in the art will be familiar with appropriate deposition techniques which may be selected from MBE, MOVPE, MOCVD, HFCVD, PVD or the like. In some embodiments, depositing at least one layer of compound semiconductor material may involve the use of intermediate layers, for example as a nucleation layer or in order to reduce a lattice mismatch. The intermediate layer may remain permanently on the substrate or else be detached from the substrate following completion of the field effect transistor.

The field effect transistor comprises any of at least one source electrode and/or at least one drain electrode. The electrodes occupy a partial volume of the field effect transistor and physically bound the channel being intended for the current flow through the field effect transistor.

At least one partial volume of the field effect transistor, i.e. the partial volume of the layer of the III-V compound semiconductor which forms the source electrode or the drain electrode, comprises at least one dopant. Such a partial volume is referenced as a doped region in the context of this description. In some embodiments of the invention, the concentration of the dopant may be greater than $1 \cdot 10^{17}$ cm$^{-3}$ or greater than $5 \cdot 10^{17}$ cm$^{-3}$. In other embodiments of the invention, the concentration of the dopant may be greater than $1 \cdot 10^{18}$ cm$^{-3}$. In still another embodiment of the invention, the concentration of the dopant may be greater than $1 \cdot 10^{19}$ cm$^{-3}$. In some embodiments of the invention, the dopant may cause the Ohmic resistance of the source and/or drain contacts to be lower than $10^{-6}$ ohm/cm$^2$.

According to the invention, the depth of penetration ranges between approximately 10 nm and approximately 200 nm. In some embodiments of the invention, the depth of penetration may be selected between approximately 10 nm and approximately 30 nm. The depth of penetration is defined as the longitudinal extent of a doped region in the direction of the normal vector of the surface of the field effect transistor. The depth of penetration may be defined with an accuracy of 50 nm or 25 nm.

In some embodiments of the invention, the gradient of the concentration of the dopant at least at the lower interface of doped region may be more than 14 nm/decade or more than 8 nm/decade. The rapid decrease of the concentration of the dopant at the edges of the doped regions avoids undesirable short cuts via deeper layers or the substrate of the field effect transistor. In some embodiments of the invention, the gradient may be determined by ion beam analysis, for example secondary ion mass spectroscopy (SIMS) or elastic recoil detection (ERD).

In some embodiments of the invention, the dopant may be selected from any of magnesium and/or silicon. Byway of example, silicon may promote n-type conductivity inside the doped region. Magnesium may promote p-type conductivity inside the doped region.

In some embodiments of the invention, the layer of the field effect transistor may comprise at least two sublayers, wherein each sublayer may comprise a III-V compound semiconductor of different composition. By way of example, a first sublayer comprising AlGaN may be deposited onto a second sublayer comprising GaN. A heterojunction will be formed at the interface between the first and second sublayers so that a two-dimensional electron gas may be formed. This may allow for a field effect transistor having higher electron mobility. In other embodiments of the invention, the interface between the first and second sublayers may be used as a diffusion barrier in order to limit the depth of penetration of at least one doped region. In still another embodiment of the invention, a plurality of sublayers of different compound semiconductor materials may be deposited to form a quantum well structure.

The field effect transistor according to the invention may be produced by depositing at least one layer by means of MOCVD. To produce lateral patterning or to bound the doped regions in the plane defined by the layer or the substrate, at least one photolithographic method step may be provided in which a masking layer is exposed and subsequently removed at least partially. By way of example, the region of the channel of the field effect transistor may be protected from the penetration of the dopants by a masking layer, so that the channel remains nominally undoped whereas doped regions forming the source and drain contacts are provided adjacent to the channel.

In some embodiments of the invention, the dopant may be introduced from the gas phase during the fabrication of the at least one layer. In some embodiments of the invention, the substrate may be heated to a temperature of between approximately 970° and approximately 1050°. In other embodiments of the invention, the substrate may be heated to a temperature of between approximately 970° and approximately 1030°. At these temperatures, the diffusion of the dopants may be limited so that they do not diffuse uncontrolledly into deeper regions of the layers of compound semiconductor materials. Unlike in the case of known field effect transistors, the doped regions do not expand to a depth of several μm. Since the diffusion is restricted, the contacts produced according to the invention have a defined depth that differs from the setpoint values only by a few nm. Nevertheless, the cited temperature range is sufficient to incorporate the dopant at electronically active lattice sites or interstices.

In some embodiments, doped regions manufactured according to the invention may be formed by partially etching at least one deposited layer of an III-V compound semiconductor. This at least one layer may, in some embodiments of the invention, comprise the material of the channel of the field effect transistor. By depositing and patterning a masking layer, the size and location of the doped regions on the substrate may be defined. By subsequent wet or dry chemical etching, a part of the material may be removed and the trench obtained may subsequently be filled with doped semiconductor material by means of epitaxial growth.

In some embodiments of the invention, the dopant may be deposited by means of ion implantation. Since the energy loss dE/dx of heavy ions in matter rises sharply at low speed (Bragg peak), a precisely defined lower limit or penetration depth of the doped regions develops even in case of ion implantation of the dopants.

Looking now at the attached drawings, which illustrate some aspects of the invention, FIG. 1 illustrates a known field effect transistor 1. The field effect transistor 1 has at least one layer 11 that may be grown on a substrate (not shown in more detail) by means of heteroepitaxy or homoepitaxy. By way of example, the substrate may comprise sapphire, silicon, silicon carbide, aluminium nitride or diamond. Between the substrate and the layer 11, optional intermediate layers may be present, for example for the purpose of nucleation, for improving adhesion or for reducing a lattice mismatch.

The layer 11 comprises at least one III-V compound semiconductor. The compound semiconductor may comprise a binary, ternary or quaternary compound of elements from the chemical groups III and V of the periodic table. The element from the third main group may be selected from gallium, aluminium, indium and/or boron. The element from the chemical group V may be selected from nitrogen, phosphorous, antimony and/or arsenic. However, the compound semiconductor comprises at least nitrogen from the chemical group V of the periodic table of the elements. In some embodiments of the invention, a further element from the chemical group V may optionally be included.

The field effect transistor 1 comprises two resistive contacts that are usable as source and drain contacts for the transistor. The resistive contacts each comprise at least one metal layer 21 and 23, which are deposited as a pure elemental phase or an alloy on the surface of the layer 11. Adjacent to the metal layers 21 and 23, doped regions 311 and 331 are formed having n-type doping or p-type doping. The doped regions have a width Y1 and Y2 and a depth of penetration X1 and X2. The width and the longitudinal extent at right angles to the plane of the drawing may be bounded by masking the surface of the layer 11 or by means of the geometric dimensions of the metal layers 21 and 23.

Looking at known semiconductor devices, the depth X1 or X2 and hence the deepest point of the interface 310 or 330 is defined by the diffusion constant of the dopant, the temperature of diffusion and the duration of the diffusion step. The reason is that the known method for manufacturing the field effect transistor 1 involves the layer 11 being tempered at increased temperature after deposition of the metal contacts 21 and 23, so that parts of the metal layer 21 or 23 diffuse into the layer 11 and thereby form doped regions 311 and 331. In known field effect transistors, the depth X1 or X2 amounts at least 1 μm. Furthermore, the depth of penetration may vary on account of the lack of control of the diffusion process, which means that a source contact 21 may have a greater depth than a drain contact 23 or vice versa.

However, doped regions 311 and 331 are bounding the channel 10 of the field effect transistor, as a result of which the electrical characteristics of the field effect transistor obtained by known methods fluctuate largely and the necessary quality of the semiconductor components needs to be ensured by means of subsequent selection. In some cases, the depth of penetration X1 or X2 may become so large that the hole thickness of the layer 11 is penetrated, thereby causing a parasitic current via deeper layers or the substrate. The scrap during production of the known field effect transistors is therefore very high.

Finally, FIG. 1 also illustrates a gate contact 23 that is separated from the surface 11 by an insulator in a manner known per se and may be used to set the conductivity of the channel.

Figure 2:
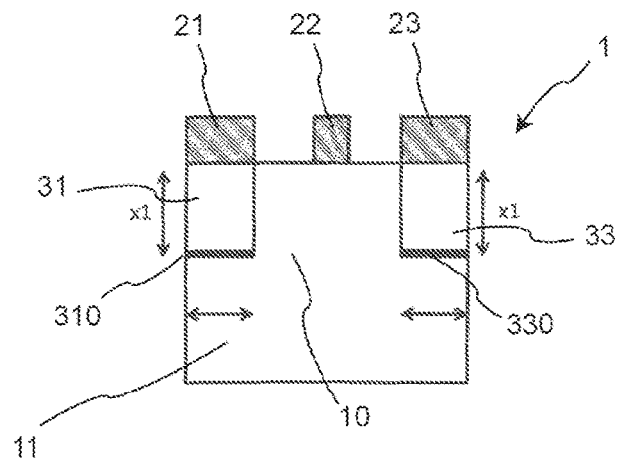
FIG. 2 illustrates the cross section through a field effect transistor based on a first embodiment of the invention.

FIG. 2 illustrates a first embodiment of the field effect transistor according to the present invention. Like parts of the invention are assigned like reference numbers. Thus, the description below is limited to the differences between different embodiments. The field effect transistor 1 according to the invention comprises at least one layer 11. The layer 11 comprises at least one III-V compound semiconductor. The compound semiconductor may comprise a binary, ternary or quaternary compound of elements from the chemical groups III and V of the periodic table. The element from the third main group may be selected from gallium, aluminium, indium and/or boron. The element from the chemical group V may be selected from nitrogen, phosphorous, antimony and/or arsenic. However, the compound semiconductor comprises at least nitrogen from the chemical group V of the periodic table of the elements. In some embodiments of the invention, a further element from the chemical group V may optionally be included.

In some embodiments, a plurality of layers may be produced above one another, for example in order to provide semiconductor heterojunctions being adapted to forma two-dimensional electron gas in the channel 10.

As FIG. 2 also illustrates, the field effect transistor according to the invention has source and drain contacts 21 and 23 that are deposited onto the surface of the layer 11 from an electrically conductive material. In some embodiments, the electrically conductive material may comprise a metal or an alloy.

Below the metal contacts 21 and 23, adjoining doped regions 31 and 33 are arranged. In some embodiments, the doped regions may comprise silicon or magnesium. In contrast to the known device shown in FIG. 1, the doped regions 31 and 33 according to the invention have a defined depth of penetration X1. The depth of penetration X1 may be selected between approximately 10 nm and approximately 200 nm in some embodiments. In other embodiments, the depth of penetration X1 may be selected between approximately 10 nm and approximately 30 nm. The smaller depth of penetration reduces the risk of parasitic currents and short cuts. Lower tolerances of the depth of penetration allow the geometric dimensions of the channel 10 to be clearly defined in all three directions. This results in predictable electronic properties for the field effect transistor with low tolerances.

For manufacturing doped regions 31 and 33 according to the invention, the respective dopant may be supplied from the gas phase during epitaxial growth of the layer 11. In order to avoid contamination of the channel 10 with the dopants, the channel 10 may be protected against the intrusion of the dopant by means of a masking layer. In some embodiments of the invention, the material of the layer 11 may be removed partially from the locations being intended to accommodate doped regions 31 and 33, for example by means of masking and wet or dry chemical etching.

In some embodiments of the invention, the substrate may be tempered after deposition of the material of the doped regions 31 and 33. In some embodiments of the invention, a temperature between approximately 970° and approximately 1050° may be used. This temperature range may limit the diffusion of the dopants to such an extent that a geometrically defined lower interface 310 or 330 is obtained. In some embodiments of the invention, the gradient of the dopants at the interface 310 or 330 may be smaller than 14 nm/decade or smaller than 8 nm/decade.

Figure 3:
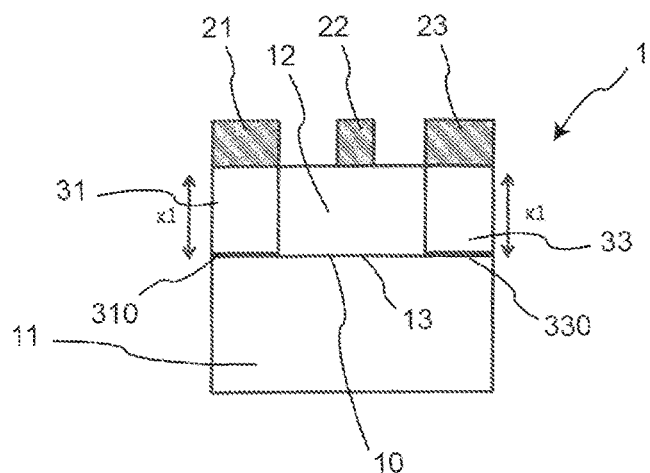
FIG. 3 illustrates the cross section through a field effect transistor based on a second embodiment of the invention.

FIG. 3 illustrates a field effect transistor according to a second embodiment of the invention. As FIG. 3 illustrates, the field effect transistor 1 comprises a first sublayer 11 and a second sublayer 12 that each comprise a compound semiconductor of different composition. By way of example, the sublayer 11 may be fabricated from a binary compound and the sublayer 12 from a ternary compound, as a result of which a two-dimensional electron gas may be formed at the interface 13 between the first sublayer 11 and the second sublayer 12. In some embodiments, the two-dimensional electron gas may comprise a higher charge carrier mobility compared to a three-dimensional electron gas.

The source and drain contacts 21 and 23 may be obtained essentially as described above with reference to the first embodiment of the invention. However, the interface 13 may act as a diffusion barrier so that the diffusion of the dopants may be stopped at the latter. As a result, the lower interfaces 310 and 330 may be defined within smaller tolerances or the gradient may be even steeper.

In some embodiments of the invention, dopants may be introduced into doped regions 31 and 33 by means of ion implantation and subsequent tempering of the device. The interface 13 acting as a diffusion barrier, allows the diffusion of the dopants to be stopped at the latter so that the depth of penetration is readily defined.

It should be clear to one of ordinary skill in the art that the invention is not limited to the embodiments shown in the figures. The description therefore has to be regarded to be explanatory and not limiting the scope of protection. The claims following are intended to be understood such that a cited feature is present in at least one embodiment of the invention. This does not preclude the presence of additional features. If the description or the claims define "first" and "second" features, this wording is intended to distinguish features of similar type without stipulating an order of rank.

The invention claimed is:

1. Field-effect transistor having at least one channel layer, said channel layer comprising a group-III-nitride compound semiconductor, wherein the field-effect transistor comprises at least one source electrode and at least one drain electrode, with the at least one source electrode and the at least one drain electrode each having at least one contact, with the at least one contact having a same or smaller depth than the channel layer;
   said source electrode and drain electrode comprising at least one doped region extending from the same surface into the at least one channel layer, wherein the depth of penetration of said doped region is selected from approximately 10 nm to approximately 200 nm, and a depth of penetration is equal or smaller than a channel depth, and the gradient of the dopant concentration at the lower interface between the channel layer and the doped region is smaller than 14 nm/decade.

2. Field-effect transistor according to claim 1, wherein the depth of penetration of said doped region is selected from approximately 10 nm to approximately 30 nm.

3. Field effect transistor according to claim 1, wherein the gradient of the dopant concentration at least at the lower interface between the channel layer and the doped region is smaller than 8 nm/decade.

4. Field effect transistor according to claim 1, wherein the dopant is selecteed from the group comprising magnesium and/or silicon.

5. Field effect transistor according to claim 1, wherein the channel layer comprises at least one first sublayer and at least one second sublayer, wherein said first and second sublayers each comprise an group-III-nitride compound semiconductor of different composition.

6. Field-effect transistor having at least one channel layer, said channel layer comprising a group-III-nitride compound semiconductor, wherein the compound semiconductor comprises at least one element from the chemical group III being selected from any of gallium, aluminium, indium and/or boron and wherein the compound semiconductor comprises further at least nitrogen, wherein the field-effect transistor comprises at least one source electrode and at least one drain electrode, with the at least one source electrode and the at least one drain electrode each having at least one contact, with the at least one contact having a same or smaller depth than the channel layer, said source electrode and drain electrode comprising at least one doped region extending from the same surface into the at least one channel layer, wherein the dopant is selected from the group comprising magnesium and/or silicon and the depth of penetration of said doped region is selected from approximately 10 nm to approximately 200 nm, and the gradient of the dopant concentration at the lower interface between the channel layer and the doped region is smaller than 14 nm/decade.

7. Field-effect transistor according to claim 6, wherein the depth of penetration of said doped region is selected from approximately 10 nm to approximately 30 nm.

8. Field effect transistor according to claim 6, wherein the gradient of the dopant concentration at least at the lower interface between the channel layer and the doped region is smaller than 8 nm/decade.

9. Field effect transistor according to claim 6, wherein the channel layer comprises at least one first sublayer and at least one second sublayer, wherein said first and second sublayers each comprise an group-III-nitride compound semiconductor of different composition.

10. A method for manufacturing a field effect transistor having at least one channel layer, said channel layer comprising a group-III-nitride compound semiconductor, said method comprising at least the steps of providing a substrate;
   depositing the at least one channel layer from a compound semiconductor onto a first surface of the substrate by means of MOCVD, wherein the compound semiconductor comprises at least one element from the chemical group III being selected from any of gallium, aluminium, indium and/or boron and wherein the compound semiconductor comprises further at least one element from the chemical group V being selected from nitrogen, phosphorous and/or arsenic, wherein the compound semiconductor comprises at least nitrogen;
   producing any of at least one source electrode and/or at least one drain electrode by forming at least one doped region extending from the first surface into the at least one channel layer, with the at least one source electrode and the at least one drain electrode each having at least one contact, with the at least one contact having a same or smaller depth than the channel layer;
   wherein the depth of penetration of said doped region is selected from approximately 10 nm to approximately 200 nm, such that the gradient of the dopant concentration at the lower interface between the channel layer and the doped region is smaller than 14 nm/decade.

11. Method according to claim 10, wherein the depth of penetration of said doped region is selected from approximately 10 nm to approximately 30 nm.

12. Method according to claim 10, wherein the dopant is supplied into the doped region from the gas phase during the fabrication of the at least one channel layer.

13. Method according to claim 10, wherein the dopant is implanted into the at least one layer.

14. Method according to claim 10, wherein the channel layer is tempered at a temperature between approximately 970° C. and approximately 1050° C.

15. Method according to claim 10, wherein the channel layer is tempered at a temperature between approximately 970° C. and approximately 1030° C.

16. Method according to claim 10, wherein the dopant is selecteed from the group comprising magnesium and/or silicon.

17. Method according to claim 10, wherein the channel layer comprises at least one first sublayer and at least one second sublayer, wherein said first and second sublayers each comprise an group-III-nitride compound semiconductor of different composition and the interface forms a diffusion barrier for the dopant.

* * * * *